United States Patent
Propp et al.

(10) Patent No.: US 11,656,286 B2
(45) Date of Patent: May 23, 2023

(54) HEALTH MONITOR FOR AN ELECTRIC MACHINE

(71) Applicant: Regal Beloit America, Inc., Beloit, WI (US)

(72) Inventors: Christopher Edwin Eugene Propp, Wausau, WI (US); Paul Steven Mullin, Yellow Springs, OH (US); Norman Carl Golm, Jr., Ft. Wayne, IN (US); Daniel Edward Phillips, McDonald, PA (US)

(73) Assignee: Regal Beloit America, Inc., Beloit, WI (US)

( * ) Notice: Subject to any disclaimer, the term of this patent is extended or adjusted under 35 U.S.C. 154(b) by 256 days.

(21) Appl. No.: 16/055,846

(22) Filed: Aug. 6, 2018

(65) Prior Publication Data

US 2020/0041571 A1 Feb. 6, 2020

(51) Int. Cl.
*G01R 31/3842* (2019.01)
*G01R 15/18* (2006.01)
(Continued)

(52) U.S. Cl.
CPC ....... *G01R 31/3842* (2019.01); *G01R 15/186* (2013.01); *G01R 31/346* (2013.01); *G01R 31/58* (2020.01)

(58) Field of Classification Search
CPC .................................................. G01R 15/186
See application file for complete search history.

(56) References Cited

U.S. PATENT DOCUMENTS 3,344,338 A * 9/1967 Sparrow ................ H02K 19/38
322/75
4,415,850 A 11/1983 Sherwood
(Continued)

FOREIGN PATENT DOCUMENTS

AU 2017203868 A1 * 6/2017
CA 2319409 A1 * 8/1999
(Continued)

OTHER PUBLICATIONS

Prabhakar Neti, Karim Younsi, Manoj R. Shah, A Novel High Sensitivity Differential Current Transformer for Online Health monitoring of Industrial Motor Ground-wall Insulation, 2013 IEEE Energy Conversion . . . , 2013 (Year: 2013).*
(Continued)

*Primary Examiner* — Matthew G Marini
(74) *Attorney, Agent, or Firm* — Armstrong Teasdale LLP

(57) ABSTRACT

A health monitor circuit for an electric machine includes a plurality of sensors, a rectifier, a memory device, and a microprocessor. The plurality of sensors includes a current transformer configured to be electromagnetically coupled to an electrical conductor that feeds a stator winding of the electric machine. The rectifier is coupled to the current transformer and is configured to convert an AC signal generated by the current transformer to a DC signal to supply power for the health monitor circuit. The microprocessor is coupled to the memory device and the plurality of sensors. The microprocessor is configured to periodically collect a stator current measurement from the current transformer and write the stator current measurement to the memory device.

20 Claims, 3 Drawing Sheets

(51) Int. Cl.
*G01R 31/34* (2020.01)
*G01R 31/58* (2020.01)

(56) References Cited

U.S. PATENT DOCUMENTS

| | | | | |
|---|---|---|---|---|
| 5,270,640 | A * | 12/1993 | Kohler | G01R 31/343 |
| | | | | 324/765.01 |
| 6,605,879 | B2 * | 8/2003 | Wade | H02J 9/062 |
| | | | | 307/66 |
| 8,102,629 | B2 | 1/2012 | Harris et al. | |
| 8,421,588 | B1 | 4/2013 | Ross et al. | |
| 8,570,047 | B1 | 10/2013 | Davies et al. | |
| 9,000,696 | B2 * | 4/2015 | Sanchez | H02P 6/182 |
| | | | | 318/400.06 |
| 9,461,486 | B2 | 10/2016 | Rozenboim | |
| 9,489,340 | B2 * | 11/2016 | Safa-Bakhsh | G06F 17/00 |
| 9,852,837 | B2 * | 12/2017 | Lu | G01R 15/183 |
| 2009/0015196 | A1 | 1/2009 | Baxter et al. | |
| 2010/0194329 | A1 * | 8/2010 | Lu | H02P 21/16 |
| | | | | 318/798 |
| 2013/0088799 | A1 * | 4/2013 | Zeller | H02H 7/0816 |
| | | | | 361/33 |
| 2014/0266240 | A1 * | 9/2014 | Haensgen | H02J 50/001 |
| | | | | 324/537 |
| 2015/0294552 | A1 * | 10/2015 | Langille | F16C 41/007 |
| | | | | 340/679 |
| 2017/0018165 | A1 | 1/2017 | Klein et al. | |
| 2017/0184657 | A1 | 6/2017 | Neti et al. | |
| 2018/0095118 | A1 | 4/2018 | Phillips | |
| 2018/0120380 | A1 | 5/2018 | Giussani et al. | |
| 2018/0166901 | A1 * | 6/2018 | Yu | H02J 7/35 |

FOREIGN PATENT DOCUMENTS

| | | | | |
|---|---|---|---|---|
| CN | 202931245 | U * | 5/2013 | |
| EP | 2418801 | A1 * | 2/2012 | G01D 4/004 |
| EP | 2418801 | A1 | 9/2012 | |
| EP | 2782225 | A1 | 9/2014 | |
| EP | 3179258 | A1 | 6/2017 | |
| WO | 2014131378 | A1 | 9/2014 | |

OTHER PUBLICATIONS

International Search Report and Written Opinion, dated Nov. 1, 2019, for related International application No. PCT/US2019/045209 (16 pgs.).

* cited by examiner

HEALTH MONITOR FOR AN ELECTRIC MACHINE

FIELD

The field of the disclosure relates generally to a health monitor for an electric machine and, more specifically, a health monitor circuit that measures stator current for an electric motor or an electric generator and harvests energy from an electromagnetic field generated by the stator current.

BACKGROUND

At least some electric machines include accelerometers and temperature sensors to periodically measure, for example, vibrations and ambient temperature around the electric machine. Such measurements can be useful in determining the amount of wear experienced by the electric machine over time as well as the general health of the electric machine. Some electric machines include piezoelectric accelerometers to measure vibration. Some electric machines include resistance temperature sensors (RTDs) embedded in circuitry of the electric machine to monitor temperature. Such sensors can be integrated into the electric machine and its housing, and are generally powered by batteries or otherwise supplied power independent of the electric machine itself. Some electric machines (electrically commutated motors, for example) include current sensors integrated onto a controller (e.g., a motor controller) for measuring stator currents to properly operate the electric machine. Other electric machines (induction motors, for example) do not need to measure stator currents to operate. Data collected by sensors can be used and stored locally on the electric machine and, more specifically, on a memory device integrated within the housing. Alternatively, the data collected by the sensors may be transferred to a remote memory device such as, for example, a mass storage device or a cloud server using wired or wireless communications. It is, however, desirable to improve the fidelity of electric machine health data without the expense of complex retrofitting.

BRIEF DESCRIPTION

In one aspect, a health monitor circuit for an electric machine includes a plurality of sensors, a rectifier, a memory device, and a microprocessor. The plurality of sensors includes a current transformer configured to be electromagnetically coupled to an electrical conductor that feeds a stator winding of the electric machine. The rectifier is coupled to the current transformer and is configured to convert an alternating current (AC) signal generated by the current transformer to a direct current (DC) signal to supply power for the health monitor circuit. The microprocessor is coupled to the memory device and the plurality of sensors. The microprocessor is configured to periodically collect a stator current measurement from the current transformer and write the stator current measurement to the memory device.

In another aspect, an electric machine includes a rotor, a stator winding, and a health monitor circuit. The rotor is configured to turn with respect to the stator winding. The stator winding is configured to be electromagnetically coupled to the rotor in response to a stator current conducted by the stator winding. The health monitor circuit includes a plurality of sensors, a rectifier, a memory device, and a microprocessor. The plurality of sensors includes a current transformer configured to be electromagnetically coupled to an electrical conductor that feeds the stator winding. The rectifier is coupled to the current transformer and is configured to convert an AC signal generated by the current transformer to a DC signal to supply power to the health monitor circuit. The microprocessor is coupled to the memory device and the plurality of sensors. The microprocessor is configured to periodically collect a stator current measurement from the current transformer and write the stator current measurement to the memory device.

In yet another aspect, a method of monitoring health of an electric machine includes conducting a stator current through a stator winding of the electric machine. The method includes electromagnetically coupling a current transformer to the stator winding. The method includes rectifying a current induced in a secondary winding of the current transformer to a DC signal and supplying the DC signal to components of the health monitor circuit. The method includes periodically collecting, by a microprocessor, a stator current measurement from the current transformer based on the current induced in the secondary winding.

DETAILED DESCRIPTION

Embodiments of the health monitor circuit described herein provide improved fidelity of electric machine health data without the expense of complex retrofitting. More specifically, health monitor circuits described herein include multiple sensors for detecting operating parameters and environmental conditions for the electric machine, including a current transformer. The current transformer enables, for example, both stator current measurement and energy harvesting for supplying power to the health monitor circuit itself. The combination of operating parameters and environmental conditions such as, for example, ambient temperature, ambient humidity, barometric pressure, and acceleration with stator current measurements enables improved analysis and monitoring of electrical and mechanical degradation, or "wear," experienced by the electric machine, and further enables inferences of various aspects of the health of the mechanical load (for electric motors) coupled to and driven by the electric motor, or the health of the machine coupled to and turning the rotor (for electric generators). The current induced by the stator current in the current transformer may be rectified and applied directly to components of the health monitor circuit, or to an energy storage device that supplies power to at least the health monitor circuit. The health monitor circuits described herein may further include voltage regulating and power distribution circuits for generating and supplying power to components of the health monitor circuit. The health monitor circuits described herein may further include current sense circuits that enable periodic collection and storage of stator current measurements (and other measurements of operating parameters and environmental conditions) controlled by a microprocessor or other suitable processing device. The health monitor circuits described herein may further include a communication interface for communicating measurements to a remote device, such as, for example, a system controller or other suitable computing system. Such a communication interface may include one or more wired communication channel or wireless communication channel.

Figure 1:
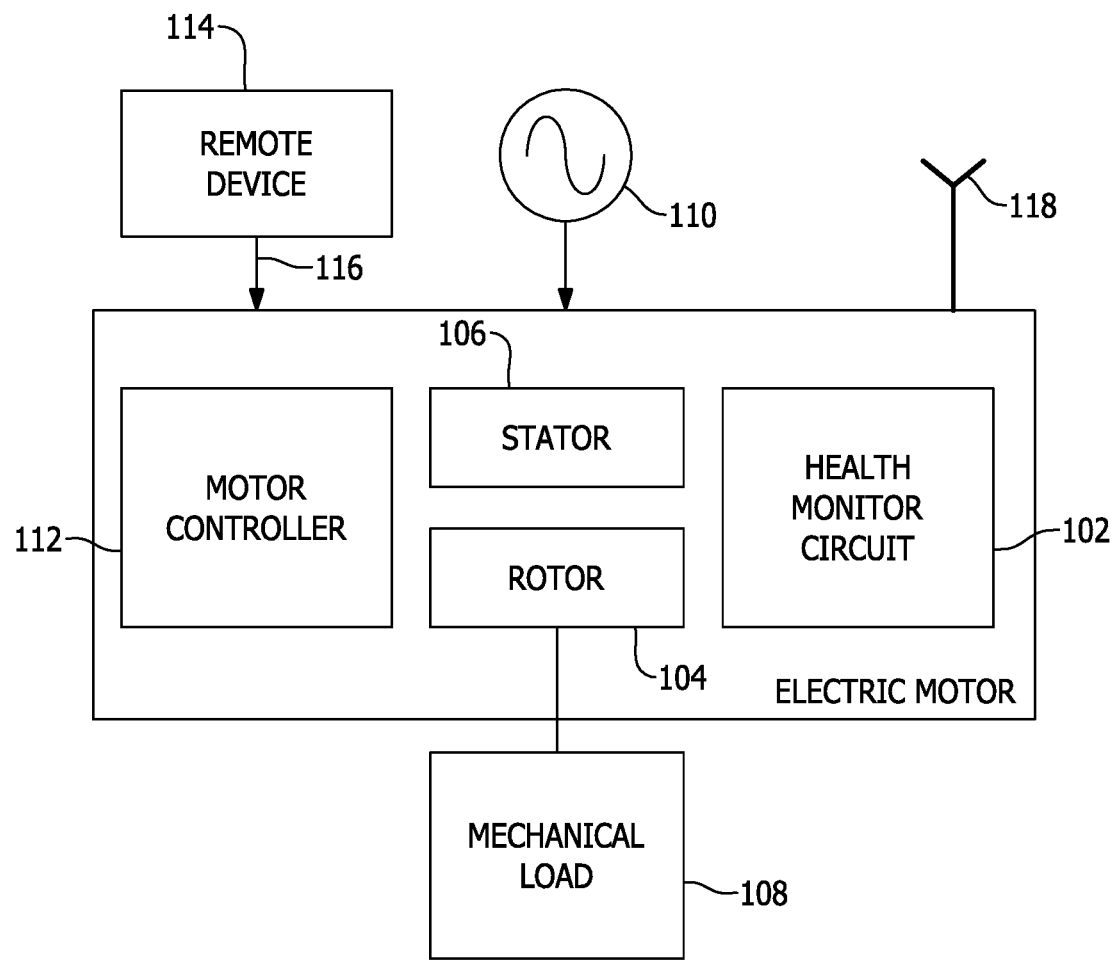
FIG. 1 is a block diagram of an example electric machine having a health monitor circuit.

FIG. 1 is a block diagram of an example electric machine 100 having a health monitor circuit 102. Electric machine 100 is illustrated as an electric motor that includes a rotor 104 and a stator 106. Rotor 104 is configured to be coupled to a mechanical load 108. Mechanical load 108 may include, for example, a rotatable load such as a fan, wheel, blower, impeller, compressor, fly wheel, transmission, or crank shaft, among others. Mechanical load 108 may also include a linear load, such as a solenoid or linear actuator, among others. In alternative embodiments, rotor 104 is configured to be coupled to a machine that turns rotor 104 to operate electric machine 100 as an electric generator. Such a machine may include a combustion engine, gas turbine, wind turbine, steam turbine, or any other suitable machine for turning rotor 104. Referring again to the embodiment of FIG. 1 in which electric machine 100 is an electric motor, stator 106 generally includes one or more stator windings (not shown) that, when energized and conducting stator current, are electromagnetically coupled to rotor 104 and cause rotor 104 to turn, on a longitudinal axis, with respect to stator 106.

Electric machine 100 is supplied alternating current (AC) from an AC source 110. AC source 110 may include, for example, an electrical grid, a diesel, wind, or turbine generator, or any other suitable AC source. AC source 110 may alternatively include one or more direct current (DC) sources having an output that is converted, or "inverted," to an AC power before being supplied to electric machine 100. AC power from AC source 110, in certain embodiments, may be applied directly to stator 106. In alternative embodiments, electric machine 100 may be supplied AC or DC power that is appropriately converted to AC and/or DC by electric machine 100 itself. For this purpose, among others, some embodiments of electric machine 100 include a motor controller 112. In other embodiments, motor controller 112 may be omitted.

Motor controller 112 generally includes one or more processors, one or more memory devices, and a drive circuit (all not shown). Generally, the drive circuit supplies electric power to stator 106 of electric machine 100 based on control signals received from the one or more processors. The drive circuit may include, for example, various power electronics for conditioning line frequency AC power to be supplied to the stator windings of electric machine 100 with a desired current, i.e., phase and amplitude, and frequency. Such power electronics may include, for example, and without limitation, one or more rectifier stages, power factor correction (PFC) circuits, filters, transient protection circuits, EMF protection circuits, inverters, or power semiconductors. Motor controller 112, in certain embodiments, may include a communication interface (not shown). The communication interface may include one or more wired or wireless hardware interface, such as, for example, universal serial bus (USB), RS232 or other serial bus, CAN bus, Ethernet, near field communication (NFC), WiFi, Bluetooth, or any other suitable digital or analog interface for establishing one or more communication channels between motor controller 112 and a remote device 114. Remote device 114 may include a system controller, smart phone, personal computer, mass storage system, cloud server, or any other suitable computing system. The communication interface may include, for example, a wired communication channel 116 to remote device 114 or an antenna 118 for establishing a wireless communication channel with remote device 114. The communication interface further includes a software or firmware interface for receiving one or more control parameters and writing them, for example, to memory. In certain embodiments, the communication interface includes, for example, a software application programming interface (API) for supplying one or more parameters for operating electric machine 100.

In alternative embodiments, the communication interface may be implemented independent of motor controller 112 such that it serves both motor controller 112 and health monitor circuit 102. In a further alternative embodiment, the communication interface may be incorporated into health monitor circuit 102.

Electric machine 100 may include a casing within which rotor 104 and stator 106 are located. Electric machine 100 may also include an electrical housing, or "conduit box," within which various electrical components of electric machine 100 may be located, such as, for example, motor controller 112 and health monitor circuit 102.

Figure 2:
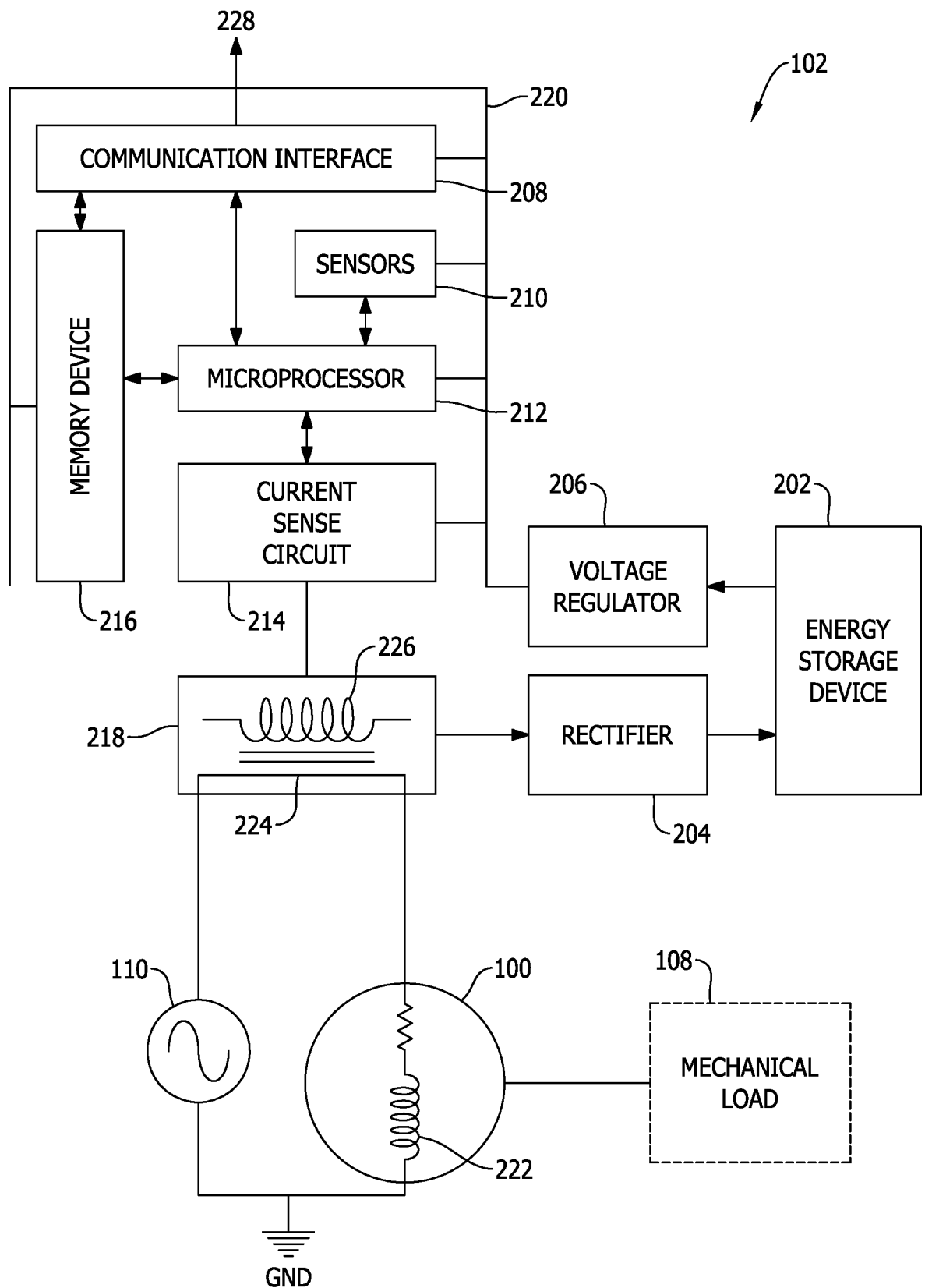
FIG. 2 is schematic diagram of a health monitor circuit for use in the electric machine shown in FIG. 1.

FIG. 2 is a schematic diagram of health monitor circuit 102 for use in electric machine 100 shown in FIG. 1. FIG. 2 further illustrates electric machine 100 being supplied AC power form AC source 110 to cause electric machine 100 and, more specifically, its rotor to operate mechanical load 108. Health monitor circuit 102 includes an energy storage device 202, a rectifier 204, a voltage regulator 206, a communication interface 208, a plurality of sensors 210, a microprocessor 212, a current sense circuit 214, a memory device 216, and a current transformer 218. In certain embodiments, memory device 216 is implemented internal to, or as a component of, microprocessor 212. In other embodiments, memory device 216 is a separate component from microprocessor 212.

Energy storage device 202 is configured to supply power to health monitor circuit 102. More specifically, to the extent rectifier 204, voltage regulator 206, communication interface 208, sensors 210, microprocessor 212, current sense circuit 214, memory device 216, and current transformer 218 require power to operate, such power is supplied by energy storage device 202. Energy storage device 202 may include, for example, one or more capacitors. In alternative embodiments, the energy storage device may include one or more batteries. Current transformer 218 and energy storage device 202, in at least some embodiments, do not supply a precise and stable voltage that is needed for many components of health monitor circuit 102. Accordingly, energy storage device 202 supplies, for example, a DC voltage to voltage regulator 206. In certain embodiments, energy storage device 202 is omitted, and power is supplied to health monitor circuit 102 directly from current transformer 218, rectifier 204, and voltage regulator 206. Voltage regulator 206 generates a stable DC voltage that can be used by the various components of health monitor circuit 102. For example, in certain embodiments, voltage regulator 206 generates a stable 3.3 Volts DC (VDC) supply. Alternatively, voltage regulator 206 may generate a stable 5 VDC supply or any other suitable regulated voltage for operating health monitor circuit 102. Voltage regulator 206 supplies the desired DC voltage on a DC bus 220, or "rail," that delivers the desired DC voltage the various components of health monitor circuit 102.

Current transformer 218 is configured to be electromagnetically coupled to a stator winding 222 of electric machine 100, of which electric machine may include one or more. More specifically, as illustrated in FIG. 2, current transformer 218 is configured to be electromagnetically coupled to an electrical conductor 224, bus, or wire, that supplies, or "feeds," stator current to stator winding 222 itself. The current conducting through electrical conductor 224 is generally assumed to be the stator current conducting through stator winding 222 itself. Current transformer 218 generally includes a primary winding, or "coil," and a secondary winding 226. For the purpose of current measurement, the conductor through which current is being measured, i.e., electrical conductor 224, is considered the primary winding. In certain embodiments, where current transformer 218 is "clamped" onto electrical conductor 224, or the "primary winding," the primary winding includes a single "turn." In alternative embodiments, where an inductive coil is utilized as a primary winding, the number of turns is simply accounted for (as a ratio of primary turns to secondary turns) in using, measuring, and interpreting the current induced in secondary winding 226.

Current transformer 218 is coupled to energy storage device 202, for example, through rectifier 204. When stator current is conducted through stator winding 222, an electromagnetic field is generated that induces a current in secondary winding 226, producing an AC signal that is received and converted, or rectified, by rectifier 204 to a DC signal for charging energy storage device 202. In alternative embodiments, energy storage device 202 is omitted and the DC signal produced by rectifier 204 is supplied directly to components of health monitor circuit 202 or voltage regulator 206. In addition to enabling harvesting of energy from the electromagnetic field generated by the stator current, the induced AC signal is also measurable and represents a measure of the stator current itself. Current sense circuit 214 enables periodic polling, or collection, of a stator current measurement from current transformer 218. Current sense circuit 214 includes, for example, amplifiers, switches, and other electrical components (not shown) to enable collection of measurements. For example, in certain embodiment, current sense circuit 214 includes a current sense amplifier that is configured to detect a voltage in a current measurement circuit, the voltage representing the current induced in secondary winding 226. The amplifier then generates and transmits an analog stator current measurement signal that represents the current induced in secondary winding 226. Additionally, current sense circuit 214 may include a switch coupled to current transformer 218 and, when commutated, closes the current measurement circuit to enable collection of the stator current measurement. The switch may be coupled directly or indirectly to current transformer 218. For example, the switch may be coupled indirectly through one or more discrete electrical components (e.g., resistors, capacitors, inductors, etc.). The current measurement circuit may include, for example, a current sense resistor, across which a voltage is detected by the current sense amplifier.

Current sense circuit 214 is coupled to microprocessor 212. Microprocessor 212 includes one or more processing devices coupled to memory device 216. Memory device 216 stores, for example, computer-executable instructions, or program code, as well as measurements collected from current transformer 218 and other sensors 210. Microprocessor 212 is configured by gaining access to and executing the computer-executable instructions, or program code, stored in memory device 216. Alternatively, microprocessor 212 may be configured by similarly gaining access to program code or firmware stored in read-only memory (ROM), random access memory (RAM), or any other suitable storage medium for program code. Microprocessor 212 is configured control the switch within current sense circuit 214 by transmitting a control signal to the switch to commutate the switch to enable collection of the stator current measurement. In certain embodiments, microprocessor 212 is configured to generate and transmit the control signal to commutate the switch at a sampling frequency of at least a frequency of the stator current supplied to the stator winding, thereby enabling collection of a stator current measurement once per cycle of the AC power supplied to the stator winding. In one embodiment, for example, the AC signal supplied to the stator winding may be a common standard frequency of 50 Hertz or 60 Hertz. In alternative embodiments, the sampling frequency at which microprocessor 212 collects stator current measurements may be greater or fewer than once per AC cycle.

Microprocessor 212 is coupled to sensors 210 and is configured to periodically collect measurements from sensors 210. Sensors 210, in certain embodiments, may include an ambient temperature sensor, an ambient humidity sensor, a barometric pressure sensor, or an acceleration sensor, such as a microelectromechanical systems (MEMS) triaxial accelerometer. Sensors 210 may also include one or more current sensors in addition to current transformer 218. Sensors 210 may include any other type of sensor or device for collecting analog or digital data from electric machine 100. Sensors 210 are configured to monitor various operating parameters and environmental conditions of or around electric machine 100. Sensors 210 may further enable monitoring of various operating parameters of mechanical load 108, particularly when combined with stator current measurements collected from current transformer 218. At least some of sensors 210 may be installed on electric machine 100 or, for example on motor controller 112, and transmit measurement data back to microprocessor 212.

Microprocessor 212 is coupled to memory device 216 and is configured to write measurements from current transformer 218 and sensors 210 to memory device 216. In certain embodiments, memory device 216 is a separate component from microprocessor 212. In alternative embodiments, memory device 216 is implemented as a component within microprocessor 212. Microprocessor 212, in certain embodiments, is also coupled to communication interface 208. Communication interface 208 may include one or more wired or wireless hardware interface, such as, for example, universal serial bus (USB), RS232 or other serial bus, CAN bus, Ethernet, near field communication (NFC), WiFi, Bluetooth, Xbee, Zigbee, DigiMesh, cellular, RF, or any other suitable digital or analog interface for establishing one or more communication channels 228 between health monitor circuit 102 and, for example, remote device 114 (shown in FIG. 1). Communication channels 228 may, in certain embodiments, be continuous, or persistent, communication channels or, alternatively, temporary, or transient, communication channels that are established when remote device 114 is within range or otherwise available to connect with communication interface 208. Communication interface 208 may include, for example, a wired connection 116 to remote device 114 or an antenna 118 for establishing a wireless communication channel with remote device 114 (all shown in FIG. 1). Communication interface 208 further includes a software or firmware interface for receiving one or more requests for reading, for example, measurement data from memory device 216. In certain embodiments, communication interface 208 may include, for example, a software application programming interface (API) for writing program code to memory device 216 or reading measurement data from memory device 216.

Health monitor circuit 102, in certain embodiments, may also include a backup battery (not shown) that supplies power to the various components of health monitor circuit 102 when electric machine 100 is not being powered or when any one of energy storage device 202, rectifier 204, voltage regulator 206, or current transformer 218 fail.

Figure 3:
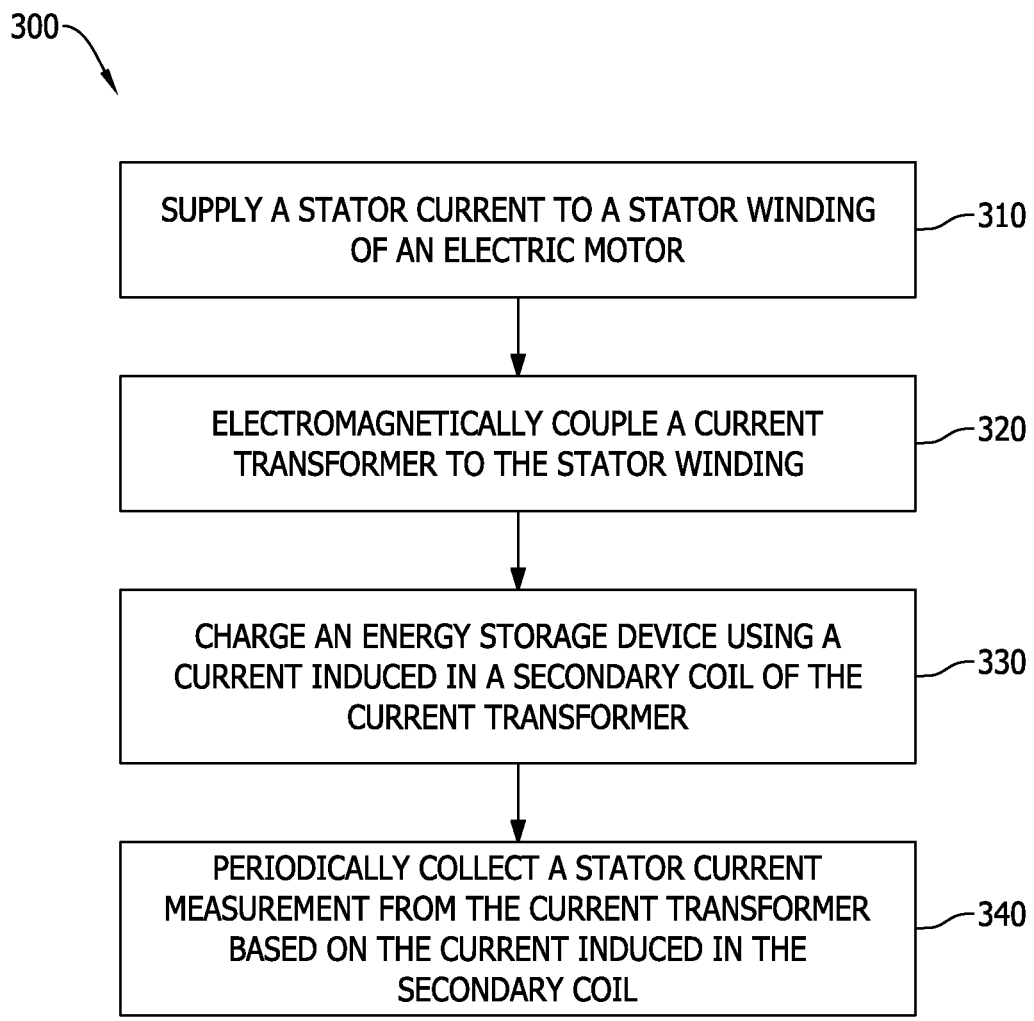
FIG. 3 is a flow diagram of an example method of monitoring health of an electric machine.

FIG. 3 is a flow diagram of an example method 300 of monitoring health of an electric machine, such as electric machine 100, e.g., an electric motor, coupled to mechanical load 108. In alternative embodiments, method 300 monitors the health of an electric generator. Method 300 includes supplying 310 stator current to stator winding 222 of electric machine 100. The stator current conducted through stator winding 222 and, more specifically, electrical conductor 224 that feeds stator winding 222, electromagnetically couples 320 current transformer 218 to stator winding 222 and, more specifically, electrical conductor 224 that feeds stator winding 222. The stator current induces a current in secondary winding 226 of current transformer 218. The induced current is used to charge 330 energy storage device 202. The induced current, which is generally an AC signal, may be rectified to a DC signal that is supplied to energy storage device 202. Energy storage device 202 then supplies a DC signal to voltage regulator 206, which regulates a desired DC voltage that is supplied to the various components of health monitor circuit 102, including, for example, microprocessor 212, sensors 210, communication interface 208, and memory device 216.

Microprocessor 212 periodically collects 340 a stator current measurement from current transformer 218 based on the current induced in secondary winding 226. Microprocessor 212 also periodically collects measurements from sensors 210 and writes measurements from sensors 210 and current transformer 218 to memory device 216. In certain embodiments, microprocessor 212 periodically collects 340 the stator current measurement by transmitting a control signal to a switch in current sense circuit 214. The switch is commutated to close a current measurement circuit in current sense circuit, which may include, for example, a current sense resistor or other suitable current sensing device. Method 300 may further include detecting a voltage in the current measurement circuit that represents the current induced in secondary winding 226. The detection may be carried out by an amplifier, such as a current sense amplifier, that then transmits an analog stator current measurement signal to microprocessor 212 that represents the current induced in the secondary winding and, further indicative of the stator current conducted through electrical conductor 224 and stator winding 222.

In certain embodiments, microprocessor 212 periodically collects 340 the stator current measurement by generating the control signal to commutate the switch within current sense circuit 214 at a sampling frequency of at least the frequency of the stator current supplied to stator winding 222.

The methods and systems described herein may be implemented using computer programming or engineering techniques including computer software, firmware, hardware or any combination or subset thereof, wherein the technical effect may include at least one of: (a) enabling stator current measurement on electric machines; (b) enabling retrofit of electric machines to add stator current measuring using a current transformer that may be "clamped" onto a stator winding or an electrical conductor that feeds the stator winding; (c) enabling measurement of additional operating parameters and environmental conditions including ambient temperature, acceleration, ambient humidity, and barometric pressure; (d) improving fidelity of data collection for improved health monitoring by increasing sampling frequency, adding measureable parameters, and combining measurement data with stator current measurements; (e) harvesting energy to power health monitor circuitry from the current transformer that enables stator current measurement; (f) enable periodic measurement of stator current by storing of energy harvested by the current transformer from the electromagnetic field generated by the stator current to further enable alternating periods of charging and measuring; and (g) enabling the electric machine to operate as a sensor for monitoring operating parameters or environmental conditions of the mechanical load to which the electric machine is coupled.

In the foregoing specification and the claims that follow, a number of terms are referenced that have the following meanings.

As used herein, an element or step recited in the singular and preceded with the word "a" or "an" should be understood as not excluding plural elements or steps, unless such exclusion is explicitly recited. Furthermore, references to "example implementation" or "one implementation" of the present disclosure are not intended to be interpreted as excluding the existence of additional implementations that also incorporate the recited features.

"Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately," and "substantially," are not to be limited to the precise value specified. In at least some instances, the approximating language may correspond to the precision of an instrument for measuring the value. Here, and throughout the specification and claims, range limitations may be combined or interchanged. Such ranges are identified and include all the sub-ranges contained therein unless context or language indicates otherwise.

Some embodiments involve the use of one or more electronic processing or computing devices. As used herein, the terms "processor" and "computer" and related terms, e.g., "processing device," "computing device," and "controller" are not limited to just those integrated circuits referred to in the art as a computer, but broadly refers to a processor, a processing device, a controller, a general purpose central processing unit (CPU), a graphics processing unit (GPU), a microcontroller, a microcomputer, a programmable logic controller (PLC), a reduced instruction set computer (RISC) processor, a field programmable gate array (FPGA), a digital signal processing (DSP) device, an application specific integrated circuit (ASIC), and other programmable circuits or processing devices capable of executing the functions described herein, and these terms are used interchangeably herein. The above embodiments are examples only, and thus are not intended to limit in any way the definition or meaning of the terms processor, processing device, and related terms.

In the embodiments described herein, memory may include, but is not limited to, a non-transitory computer-readable medium, such as flash memory, a random access memory (RAM), read-only memory (ROM), erasable programmable read-only memory (EPROM), electrically erasable programmable read-only memory (EEPROM), and non-volatile RAM (NVRAM). As used herein, the term "non-transitory computer-readable media" is intended to be representative of any tangible, computer-readable media, including, without limitation, non-transitory computer storage devices, including, without limitation, volatile and non-volatile media, and removable and non-removable media such as a firmware, physical and virtual storage, CD-ROMs, DVDs, and any other digital source such as a network or the Internet, as well as yet to be developed digital means, with the sole exception being a transitory, propagating signal. Alternatively, a floppy disk, a compact disc-read only memory (CD-ROM), a magneto-optical disk (MOD), a digital versatile disc (DVD), or any other computer-based device implemented in any method or technology for short-term and long-term storage of information, such as, computer-readable instructions, data structures, program modules and sub-modules, or other data may also be used. Therefore, the methods described herein may be encoded as executable instructions, e.g., "software" and "firmware," embodied in a non-transitory computer-readable medium. Further, as used herein, the terms "software" and "firmware" are interchangeable, and include any computer program stored in memory for execution by personal computers, workstations, clients and servers. Such instructions, when executed by a processor, cause the processor to perform at least a portion of the methods described herein.

Also, in the embodiments described herein, additional input channels may be, but are not limited to, computer peripherals associated with an operator interface such as a mouse and a keyboard. Alternatively, other computer peripherals may also be used that may include, for example, but not be limited to, a scanner. Furthermore, in the exemplary embodiment, additional output channels may include, but not be limited to, an operator interface monitor.

The systems and methods described herein are not limited to the specific embodiments described herein, but rather, components of the systems and/or steps of the methods may be utilized independently and separately from other components and/or steps described herein.

Although specific features of various embodiments of the disclosure may be shown in some drawings and not in others, this is for convenience only. In accordance with the principles of the disclosure, any feature of a drawing may be referenced and/or claimed in combination with any feature of any other drawing.

This written description uses examples to provide details on the disclosure, including the best mode, and also to enable any person skilled in the art to practice the disclosure, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A health monitor circuit for an electric machine, the health monitor circuit comprising:
   a plurality of sensors including a current transformer configured to be electromagnetically coupled to an electrical conductor that feeds a stator winding of the electric machine, wherein the current transformer enables measurement of a stator current conducted through the stator winding;
   a rectifier coupled to the current transformer and configured to convert an alternating current (AC) signal generated by the current transformer to a direct current (DC) signal to supply power for the health monitor circuit;
   a memory device; and
   a microprocessor coupled to the memory device and the plurality of sensors, the microprocessor configured to:
      at a sampling frequency of at least a frequency of an AC signal conducted by the stator winding, control alternating directly between first periods of supplying power for the health monitor circuit and second periods of receiving stator current measurements at least once per cycle of the AC signal supplied to the stator winding before reverting back to supplying power for the health monitor circuit and subsequently switching to cause a next stator current measurement to be collected;
      periodically receive the stator current measurements from the current transformer; and
      write the periodically received stator current measurements to the memory device.

2. The health monitor circuit of claim 1, wherein the microprocessor is further configured to periodically receive measurements from the plurality of sensors and write the measurements to the memory device.

3. The health monitor circuit of claim 1 further comprising a current sense circuit including an amplifier configured to generate an analog stator current measurement signal representing a current induced in a secondary winding of the current transformer.

4. The health monitor circuit of claim 1 further comprising a current sense circuit including a switch coupled to the current transformer and the microprocessor, the microprocessor configured to control the switch to periodically enable reception of the stator current measurement from the current transformer.

5. The health monitor circuit of claim 4, wherein the microprocessor is further configured to control the switch to enable collection of the stator current measurement at the sampling frequency of at least the frequency of the AC signal conducted by the stator winding.

6. The health monitor circuit of claim 1 further comprising an energy storage device coupled to the rectifier and configured to charge in response to the DC signal supplied by the rectifier and to further supply power for the health monitor circuit.

7. The health monitor circuit of claim 1 further comprising a voltage regulator coupled to the rectifier, the voltage regulator configured to regulate the DC signal supplied by the rectifier to a desired DC voltage to be supplied to at least the microprocessor and the memory device.

8. An electric machine comprising:
   a rotor;
   a stator winding with respect to which the rotor turns and configured to be electromagnetically coupled to the rotor in response to a stator current conducted by the stator winding; and
   a health monitor circuit comprising:
      a plurality of sensors including a current transformer configured to be electromagnetically coupled to an electrical conductor that feeds the stator winding, wherein the current transformer enables measurement of a stator current conducted through the stator winding;
      a rectifier coupled to the current transformer and configured to convert an alternating current (AC) signal generated by the current transformer to a direct current (DC) signal to supply power to the health monitor circuit;

a memory device; and a microprocessor coupled to the memory device and the plurality of sensors, the microprocessor configured to:

at a sampling frequency of at least a frequency of an AC signal conducted by the stator winding, control alternating directly between first periods of supplying power for the health monitor circuit and second periods of receiving stator current measurements at least once per cycle of the AC signal supplied to the stator winding before reverting back to supplying power for the health monitor circuit and subsequently switching to cause a next stator current measurement to be collected;

periodically receive the stator current measurements from the current transformer; and write the periodically received stator current measurements to the memory device.

9. The electric machine of claim 8 further comprising a communication interface coupled to the microprocessor and configured to transmit at least the stator current measurement to a remote device using at least one of a wired communication channel and a wireless communication channel.

10. The electric machine of claim 8 further comprising an energy storage device coupled to the rectifier and configured to charge in response to the DC signal supplied by the rectifier and to further supply power to the health monitor circuit.

11. The electric machine of claim 8, wherein the plurality of sensors further includes a barometric pressure sensor.

12. The electric machine of claim 8, wherein the plurality of sensors further includes an ambient humidity sensor.

13. The electric machine of claim 8 further comprising a backup battery configured to supply power to the health monitor circuit.

14. The electric machine of claim 8 further comprising:
a casing within which the rotor and the stator are located; and
an electrical housing coupled to the casing and within which the health monitor circuit is located.

15. A method of monitoring health of an electric machine using a health monitor circuit, the method comprising:
conducting a stator current through a stator winding of the electric machine;
electromagnetically coupling a current transformer to an electrical conductor that feeds the stator winding, wherein the current transformer enables measurement of the stator current conducted through the stator winding;
rectifying a current induced in a secondary winding of the current transformer to a direct current (DC) signal and supplying the DC signal to components of the health monitor circuit;
at a sampling frequency of at least a frequency of an AC signal conducted by the stator winding, controlling, by a microprocessor, alternating directly between first periods of supplying power for the health monitor circuit and second periods of receiving stator current measurements at least once per cycle of the AC signal supplied to the stator winding before reverting back to supplying power for the health monitor circuit and subsequently switching to cause a next stator current measurement to be collected; and
periodically receiving, by the microprocessor, the stator current measurements from the current transformer.

16. The method of claim 15 further comprising periodically receiving, by the microprocessor, measurements from a plurality of sensors, including the current transformer, and writing the measurements to a memory device.

17. The method of claim 15, wherein periodically receiving the stator current measurement comprises:
transmitting, by the microprocessor, a control signal to a switch;
commutating the switch based on the control signal to close a current measurement circuit;
detecting, by an amplifier, a voltage in the current measurement circuit representing the current induced in the secondary winding of the current transformer; and
transmitting an analog stator current measurement signal, to the microprocessor, representing the current induced in the secondary winding of the current transformer.

18. The method of claim 17, wherein periodically receiving the stator current measurement further comprises generating, by the microprocessor, the control signal to commutate the switch at the sampling frequency.

19. The method of claim 15 further comprising charging an energy storage device using the DC signal, and supplying power to the health monitor circuit from the energy storage device.

20. The method of claim 15 further comprising:
supplying the DC signal to a voltage regulator; and
regulating a desired DC voltage and supplying the desired DC voltage to at least the microprocessor.

\* \* \* \* \*